(12) United States Patent
Muckenhuber

(10) Patent No.: US 8,318,316 B2
(45) Date of Patent: *Nov. 27, 2012

(54) USE OF A POLYMER COMPOSITE FOR THE PRODUCTION OF PHOTOVOLTAIC MODULES

(75) Inventor: Harald Muckenhuber, Graz (AT)

(73) Assignee: Isovoltaic AG, Lebring (AT)

( * ) Notice: Subject to any disclaimer, the term of this patent is extended or adjusted under 35 U.S.C. 154(b) by 421 days.

This patent is subject to a terminal disclaimer.

(21) Appl. No.: 12/597,597

(22) PCT Filed: May 8, 2008

(86) PCT No.: PCT/AT2008/000159
§ 371 (c)(1),
(2), (4) Date: Oct. 26, 2009

(87) PCT Pub. No.: WO2008/138022
PCT Pub. Date: Nov. 20, 2008

(65) Prior Publication Data
US 2010/0119841 A1    May 13, 2010

(30) Foreign Application Priority Data

May 10, 2007   (AT) .................................. A 734/2007

(51) Int. Cl.
*B32B 27/34*   (2006.01)
*B32B 27/40*   (2006.01)

(52) U.S. Cl. ............... 428/475.2; 428/423.5; 428/423.7; 428/480

(58) Field of Classification Search ............... 428/474.4, 428/475.2, 480, 423.5, 423.7
See application file for complete search history.

(56) References Cited

U.S. PATENT DOCUMENTS

| | | | |
|---|---|---|---|
| 6,521,825 B2 * | 2/2003 | Miura et al. ................... | 136/251 |
| 6,680,124 B1 * | 1/2004 | Araki et al. .................... | 428/421 |
| 2002/0128412 A1 | 9/2002 | Kitahara et al. | |
| 2009/0151774 A1 | 6/2009 | Depine et al. | |
| 2010/0059105 A1 * | 3/2010 | Muckenhuber ............... | 136/251 |

FOREIGN PATENT DOCUMENTS

| | | |
|---|---|---|
| AT | 502 234 A1 | 2/2007 |
| EP | 1 245 657 A1 | 10/2002 |
| WO | 0167523 | 9/2001 |

OTHER PUBLICATIONS

International Search Report dated Aug. 5, 2008 in PCT application.

* cited by examiner

*Primary Examiner* — Thao T. Tran
(74) *Attorney, Agent, or Firm* — Young & Thompson

(57) ABSTRACT

A plastic composite including a carrier material of polyethylene terephthalate (PET), polyethylene naphthalate (PEN) or ethylene tetrafluoroethylene copolymer (ETFE), and polyamide-12 layers (PA-12) adjoining the carrier material on both sides, can be utilized for the production of photovoltaic modules. The combination of carrier material with PA-12 provides improved insulating capacity for the module along with improved adhesion of the composite layers.

20 Claims, 4 Drawing Sheets ial 1, 1' used according to the invention. The encap-
USE OF A POLYMER COMPOSITE FOR THE PRODUCTION OF PHOTOVOLTAIC MODULES

FIELD OF THE INVENTION

The invention relates to the use of a plastic composite for the production of photovoltaic modules.

BACKGROUND OF THE INVENTION

Photovoltaic modules are used to generate electrical energy from sunlight and consist of a laminate which contains a solar cell system as the core layer. This core layer is encapsulated with encapsulating materials which serve as protection against mechanical and weathering-induced influences. These materials can consist of one or more layers of glass and/or plastic films and/or plastic composites.

At the present time, film composites of fluoropolymer films and polyester are used as standard for weather-resistant film laminates. In this case, the fluoropolymer film on the outside guarantees weathering resistance, the polyester film guarantees the mechanical stability and the desired electrical insulation properties. Another fluoropolymer film on the inside is used for binding to the sealing layer of the solar cell system.

At the same time, the fluoropolymer films exhibit only low adhesion to the sealing layer which is used as embedding material for the solar cells themselves. Furthermore, the fluoropolymer film only contributes to a minor extent to the electrical insulation, resulting in the need to use a comparatively thick polyester film.

The present invention wishes to remedy this.

SUMMARY OF THE INVENTION

The invention relates to the use of a plastic composite, comprising a carrier material selected from the group of polyethylene terephthalate (PET), polyethylene naphthalate (PEN) or ethylene tetrafluoroethylene copolymer (ETFE), as well as polyamide-12 layers adjoining the carrier material on both sides to produce photovoltaic modules. This use makes it possible to achieve excellent adhesion to the sealing layer which serves as embedding material for the solar cell(s) and at the same time makes it possible to use thinner polymer films since polyamide-12 possesses comparable insulation properties to polyester.

Advantageous embodiments of the use according to the invention are disclosed herein.

DETAILED DESCRIPTION OF THE INVENTION

The invention is explained in detail hereinafter with reference to possible embodiments of the invention—see FIGS. 1 to 4—as well as with reference to a possible exemplary embodiment.

Figure 1:
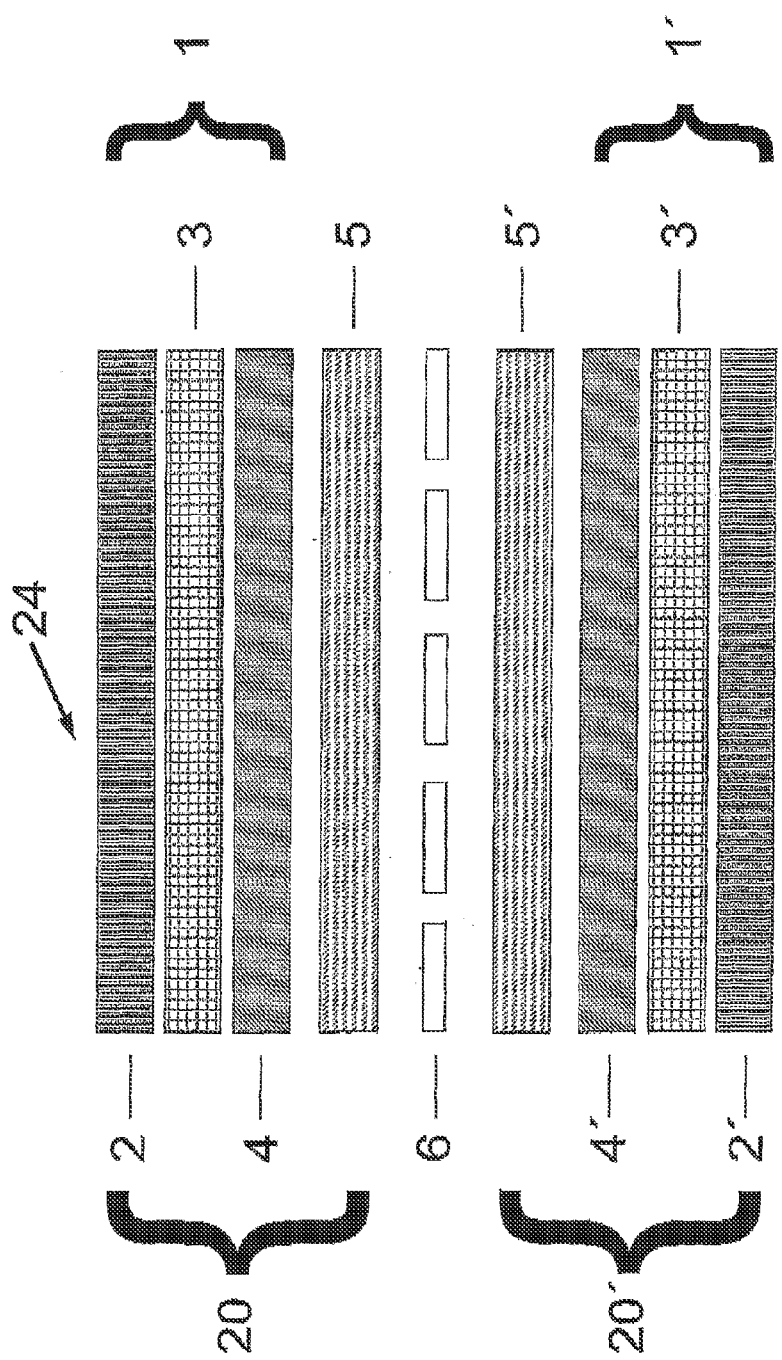
FIG. 1 illustrates an exemplary structure of a photovoltaic module in which the solar cell system is encapsulated with the plastic composite material according to the invention.

FIG. 1 shows the exemplary structure of a photovoltaic module 24 in which the solar cell system is encapsulated with the material 1, 1' used according to the invention. The encapsulating material 1, 1' substantially consists of a weather-resistant film 2, 2' and a carrier material 3, 3' which is adjoined by a film 4, 4' as an adhesion promoter to the sealing layer 5, 5'. The sealing layer 5, 5' produces the non-positive connection to the solar cell system 6.

Figure 2:
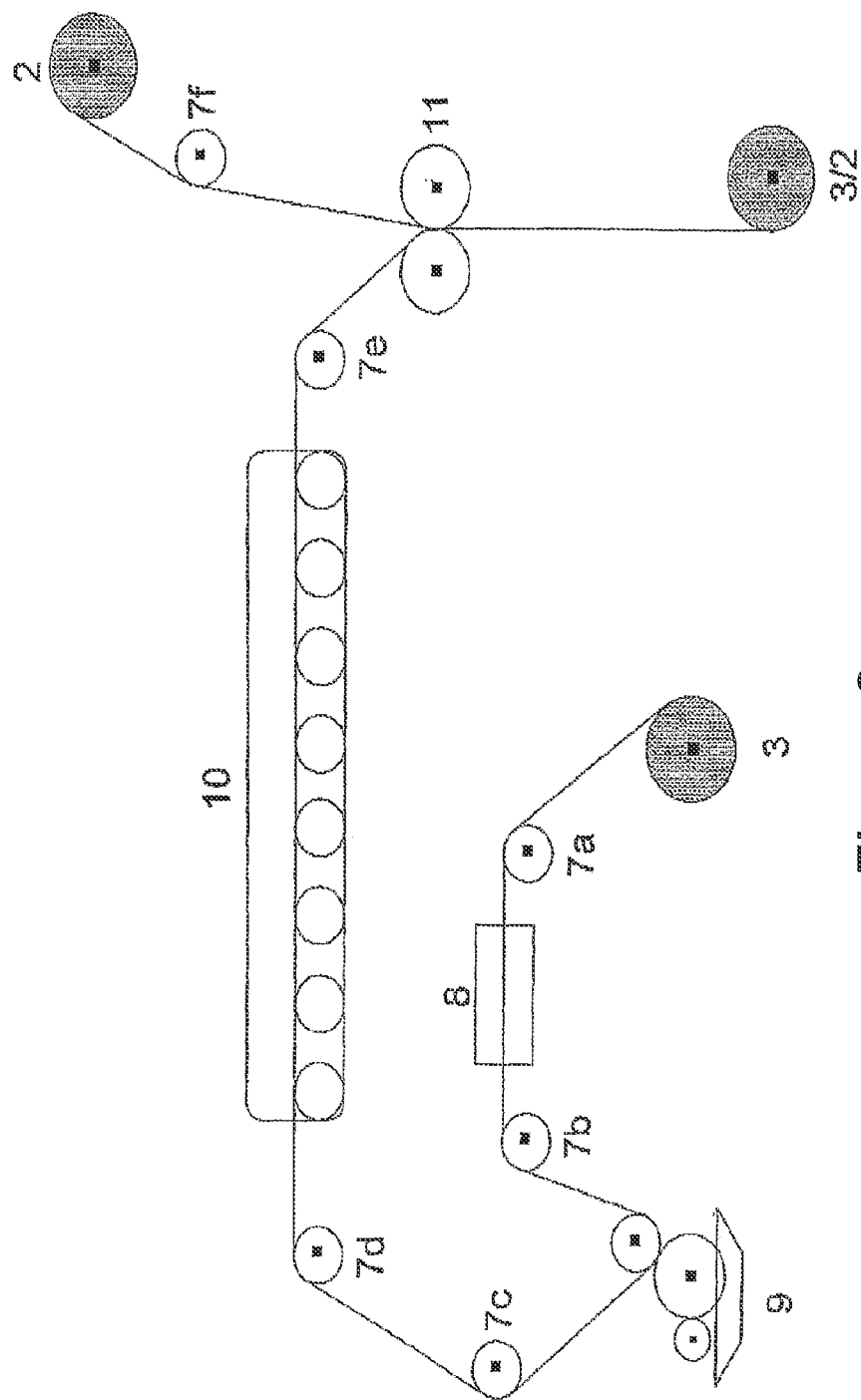
FIG. 2 illustrates a possible laminating device for producing the plastic composite according to the invention.

FIG. 2 shows a possible laminating device for producing the plastic composite used according to the invention. A carrier material 3 which is selected according to the exemplary embodiment, is coated with adhesive by means of the applicator unit 9 and after passing through a drier 10 is adhesively bonded to the weather-resistant film 2. In this case, the weather-resistant film 2 can be transparent or coloured. The contact between the two films is controlled by the pressing pressure between the rollers 11. The carrier material 3 which can be transparent or coloured can also be pre-treated by means of physical media 8 in any embodiment according to Example a). In a second similar process step, the 3/2 composite consisting of the carrier material 3 and the weather-resistant film 2 is adhesively bonded with the film 4 serving as an adhesion promoter—see FIG. 1.

In this case, the film 4 serving as an adhesion promoter can be transparent or coloured. The adhesive bonding of the carrier film 3 can be accomplished firstly with the film 4 serving as an adhesion promoter and only in the second process step with the weather-resistant film 2.

Figure 3:
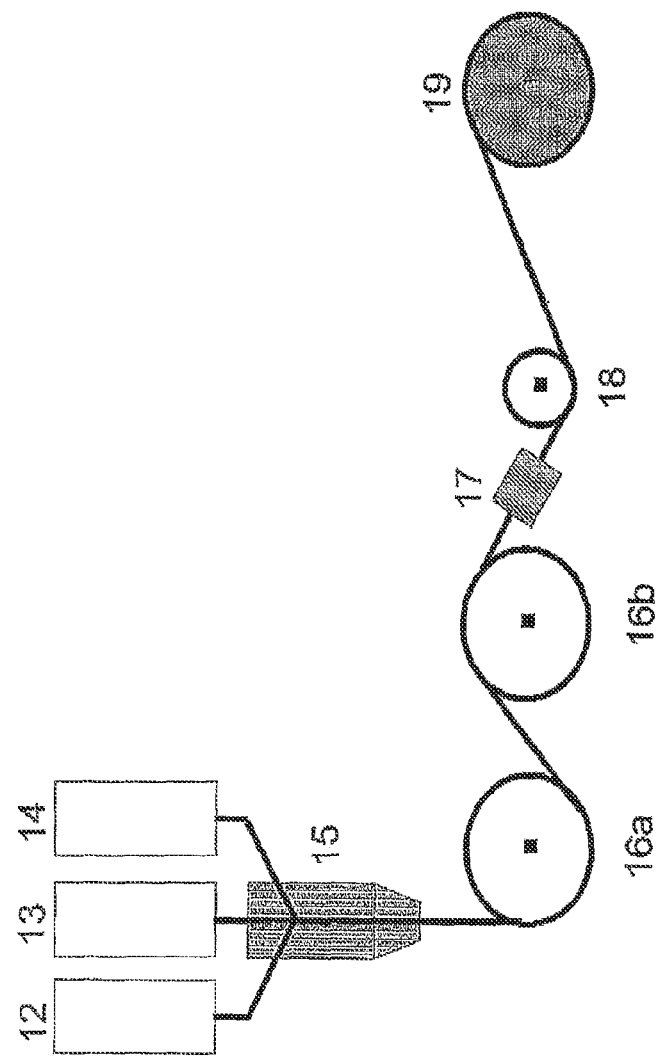
FIG. 3 illustrates a possible device for co-extrusion of a weather-resistant film.

FIG. 3 shows schematically a possible device for co-extrusion of the weather-resistant film 2, the carrier material 3 and the film 4 serving as an adhesion promoter 4 in order to produce a non-positive composite. The structure of the co-extrusion system can be modified depending on the process. Melts of the polymers of which the materials 2, 3 and 4 consist are located in the containers 12, 13 and 14. Only one polymer is located in each container. A co-extrudate of the weather-resistant film 2, the carrier film 3 and the film 4 serving as an adhesion promoter is produced by means of a slotted nozzle 15. This co-extrudate is extruded onto a cooling roller 16a and is fed from there via another cooling roller 16b to the reeling system 19. An inline thickness measurement 17 takes place in the course of the process. An additional adhesion promoter layer, as described for example in the patents DE 19720317, EP 837088 or EP 509211, can be co-extruded between the carrier material 3 and the weather-resistant film 2 or between the carrier material 3 and the film 4 serving as an adhesion promoter or also between the carrier material 3 and the films 2 and 4. In the first two cases, the co-extrudate consists of four layers, in the latter case it consists of five layers. The system for co-extrusion according to FIG. 3 can be correspondingly modified for this purpose.

For use of the plastic composite as encapsulating material for solar cells 6, as shown in FIG. 1, the composite 1 now present as rolled material is discontinuously cut to length and joined to the sealing layer 5 which can be selected according to the exemplary embodiment.

Figure 4:
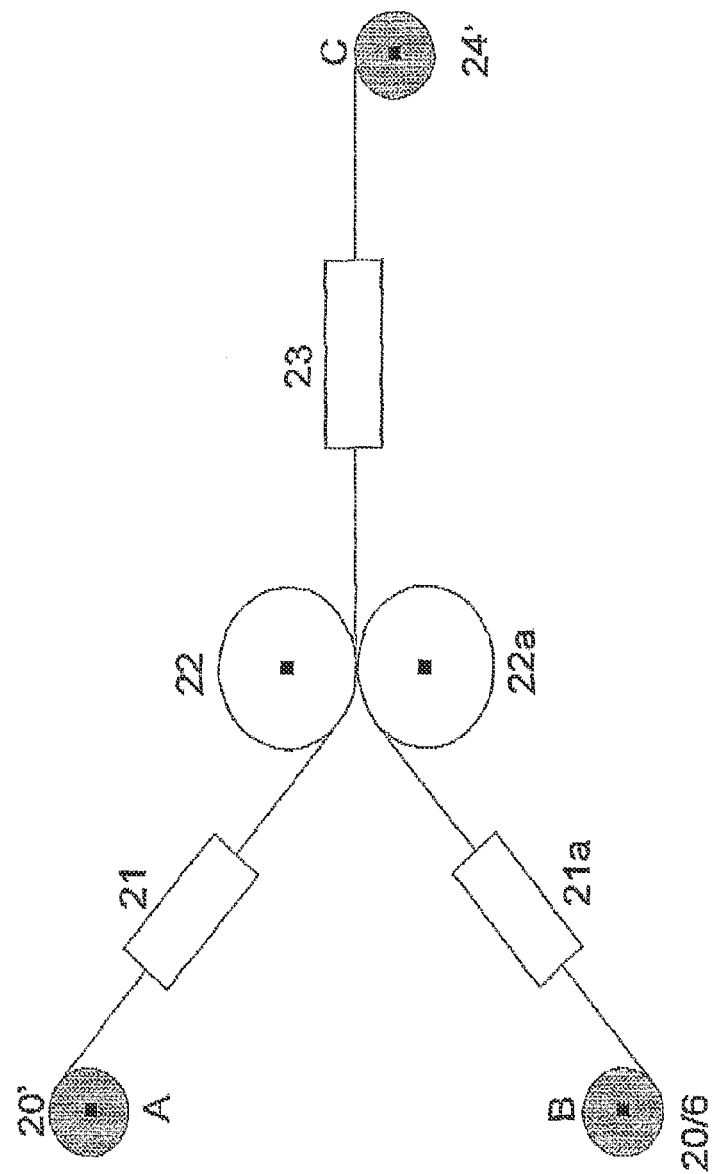
FIG. 4 illustrates a possible production method for a photovoltaic module according to the invention.

The laminating process certainly gives a composite of the layers 2, 3, 4, 5 but the further curing of the plastics used in the composite takes place during the final production of the pre-composite for a photovoltaic module 24 which, as shown in FIG. 4, can take place, for example, by a so-called roll-to-roll method.

In this case, for example, a composite 20 consisting of the encapsulating material 1 and the sealing layer 5 in conjunction with the solar cell system 6, consisting of flexible solar cell types, is rolled up on the storage roll B. Another composite 20' consisting of the encapsulating material 1' and the sealing layer 5' is withdrawn from the opposite storage roll A and fed to the solar cell system 6 which is withdrawn together with the composite 20 from the storage roll B. At the same time, the material webs withdrawn from the storage rolls A or B are each fed to a heating station 21 or 21a in which the encapsulating materials are at least heated to the softening temperature of the sealing layer 5 or 5'. This ensures the formation of a composite between the layers 20 and 20' on the one hand as well as the solar system 6 and the layers 20 and 20' on the other hand. In order to achieve curing of this pre-composite and complete cross-linking of the polymers used in the encapsulating materials, this is fed to a heating station 23. The pre-composite 24' for a photovoltaic module can be stored on the storage roll C and accordingly withdrawn from this again as required.

The following exemplary embodiment reproduces possible variants for the selection of the components in the respective layers:

Weather-resistant film 2, 2': polyamide 12 (PA12),

Carrier material 3, 3': polyethylene terephthalate (PET), polyethylene naphthalate (PEN), ethylene tetrafluoroethylene copolymer (ETFE), as well as co-extrudates thereof in the form of films or film composites.

Film as adhesion promoter 4, 4': polyamide 12 (PA12)

Sealing layer 5, 5': ethylene vinyl acetate (EVA), polyvinyl butyral (PVB), ionomers, polymethyl methacrylate (PMMA), polyurethane, polyester or hotmelt.

The aforesaid composites can also be subjected to a chemical or physical surface treatment.

As a result of the use of polyamide 12 according to the invention as a film 4, 4' which serves as an adhesion promoter or additionally also as a weather-resistant film 2, 2', relatively thin carrier films 3, 3' can be used for the encapsulating material 1, 1' in a photovoltaic module 24, as shown in FIG. 1. It is possible to use thin carrier films 3, 3' since polyamide 12 has a comparatively high electrical insulating capacity in contrast to fluoropolymer films. A 40 µm thick PA12 film has a maximum permissible system voltage of 424 V (measured in accordance with IEC 60664-1/IEC 61730-2). A PVF film (37 µm) has a maximum permissible system voltage of 346 V (measured in accordance with IEC 60664-1/IEC 61730-2). The insulating capacity of PA12 is comparable to that of polyethylene terephthalate.

The use of polyamide 12 as film 4, 4' which serves as an adhesion promoter likewise ensures a significantly improved adhesion to the sealing layer 5, 5' which can be selected according to the exemplary embodiment. PA12 exhibits an adhesion of >60 N/cm, for example, with respect to EVA film (Type Etimex 486 Fast Cure). An adhesion of only ≧4 N/cm can be guaranteed with a PVF film. In order to achieve comparable adhesions to polyamide 12, an additional physical surface treatment or chemical coating (primer) is required for fluoropolymer films such as those currently used as standard in the encapsulation technique for photovoltaic modules.

The use of polyamide 12 also has the advantage that when disposing of the photovoltaic modules, the fraction of fluorine-containing polymers can be avoided compared to the usual commercial module structures.

The invention claimed is:

1. A plastic composite for photovoltaic modules, comprising:
    a carrier material of polyethylene terephthalate (PET) or polyethylene naphthalate (PEN), and
    polyamide-12 layers adjoining the carrier material on both sides.

2. The plastic composite according to claim 1, wherein the carrier material is non-positively joined to the polyamide-12-layers by an adhesive layer.

3. The plastic composite according to claim 2, wherein an adhesive in the adhesive layer is a polyurethane; and/or a polyester adhesive.

4. The plastic composite according to claim 1, wherein the composite is produced by co-extrusion.

5. The plastic composite according to claim 4, further comprising at least one adhesion promoter layer between the carrier material and one or more of the polyamide-12 layers.

6. The plastic composite according to claim 1, comprising a polymer film provided with an oxide layer deposited from a vapour phase, positioned between the layers.

7. The plastic composite according to claim 6, wherein the polymer film comprises:
    a film of polyethylene terephthalate (PET) or polyethylene naphthalate (PEN), and
    a co-extrudate therefrom in a form of films or film composites.

8. The plastic composite according to claim 6, wherein the oxide layer comprises an aluminium oxide or silicon oxide.

9. The plastic composite according to claim 1, comprising an aluminium film positioned between the layers.

10. The plastic composite according to claim 1, further comprising an adhesion layer on at least one surface of the carrier material.

11. The plastic composite according to claim 10, wherein the adhesion layer is single- or multi-layered and comprises at least one of polyurethane, polyester and polyacrylate.

12. The plastic composite according to claim 10, wherein the adhesion layer is applied by a means for co-extrusion.

13. The plastic composite according to claim 10, wherein the adhesion layer is applied by a roller application unit.

14. The plastic composite according to claim 1, wherein at least one of the carrier material and the polyamide-12 layer is coloured.

15. The plastic composite according to claim 1, wherein the carrier material is pretreated by a means for physical media.

16. The plastic composite according to claim 1, further comprising a sealing layer applied to at least one of the polyamide-12 layer.

17. The plastic composite according to claim 16, wherein the sealing layer comprises:
    at least one of ethylene vinyl acetate (EVA), polyvinyl butyral (PVB), ionomers, polymethyl methacrylate (PMMA), polyurethane, polyester or hotmelt, and
    co-extrudates thereof in a form of films or film composites.

18. The plastic composite according to claim 16, wherein the polyamide-12 layer is treated physically and/or chemically on a surface that is applied to the sealing layer.

19. The plastic composite according to claim 7, wherein the oxide layer deposited from the vapour phase comprises aluminum oxide or silicon oxide.

20. A photovoltaic module, comprising:
    (i) a solar cell;
    (ii) a carrier layer of polyethylene terephthalate (PET) or polyethylene naphthalate (PEN);
    (iii) a film layer of polyamide-12 (PA-12), said film layer applied to each of a first side and a second side of the carrier layer; and
    (iv) a sealing layer of applied to at least one of the film layers of PA-12 (iii).

* * * * *